(12) United States Patent
He et al.

(10) Patent No.: US 6,572,935 B1
(45) Date of Patent: Jun. 3, 2003

(54) OPTICALLY TRANSPARENT, SCRATCH-RESISTANT, DIAMOND-LIKE CARBON COATINGS

(75) Inventors: Xiao-Ming He, Los Alamos, NM (US); Deok-Hyung Lee, Garland, TX (US); Michael A. Nastasi, Santa Fe, NM (US); Kevin C. Walter, Boerne, TX (US); Michel G. Tuszewski, Los Alamos, NM (US)

(73) Assignee: The Regents of the University of California, Los Alamos, NM (US)

(*) Notice: Subject to any disclaimer, the term of this patent is extended or adjusted under 35 U.S.C. 154(b) by 0 days.

(21) Appl. No.: 09/428,269

(22) Filed: Oct. 27, 1999

Related U.S. Application Data (63) Continuation-in-part of application No. 09/268,096, filed on Mar. 13, 1999.

(51) Int. Cl.[7] .............................................. C23C 16/27
(52) U.S. Cl. .................... 427/577; 427/249.7; 427/534; 427/902; 427/904
(58) Field of Search ........................... 427/577, 249.7, 427/904, 534, 902

(56) References Cited

U.S. PATENT DOCUMENTS 5,712,000 A * 1/1998 Wei et al.
5,763,087 A   6/1998 Falabella ................... 428/408

FOREIGN PATENT DOCUMENTS

| JP | 08-012492 | * | 1/1986 |
| JP | 05208806  | * | 8/1993 |

OTHER PUBLICATIONS

Kumar, Appl. Phys. Lett. 58 (17), Apr. 29, 1991, pp. 1836–1838.*

Yves Catherine *Diamond and Diamond–Like Films and Coatings*, NATO ASI Series B, vol. 266, Eds. R.E. Clausing et al. (Plenum Press, New York (1991)), pp. 193 ff.

C.A. Volkert, "Stress and Plastic Flow in Silicon During Amorphization by Ion Bombardment," J. Appl. Phys. 70, 3521 (1991).

* cited by examiner

*Primary Examiner*—Timothy Meeks
(74) *Attorney, Agent, or Firm*—Samuel M. Freund (57) ABSTRACT

A plasma-based method for the deposition of diamond-like carbon (DLC) coatings is described. The process uses a radio-frequency inductively coupled discharge to generate a plasma at relatively low gas pressures. The deposition process is environmentally friendly and scaleable to large areas, and components that have geometrically complicated surfaces can be processed. The method has been used to deposit adherent 100–400 nm thick DLC coatings on metals, glass, and polymers. These coatings are between three and four times harder than steel and are therefore scratch resistant, and transparent to visible light. Boron and silicon doping of the DLC coatings have produced coatings having improved optical properties and lower coating stress levels, but with slightly lower hardness.

12 Claims, 13 Drawing Sheets

OPTICALLY TRANSPARENT, SCRATCH-RESISTANT, DIAMOND-LIKE CARBON COATINGS

REFERENCE TO RELATED CASES

This is a continuation-in-part of application Ser. No. 09/268,096, filed on Mar. 13, 1999.

This invention was made with government support under Contract No. W-7405-ENG-36 awarded by the U.S. Department of Energy to The Regents of the University of California. The government has certain rights in the invention.

FIELD OF THE INVENTION

The present invention relates generally to the formation of optically transparent, scratch-resistant adherent coatings on substrates and, more particularly, to the formation of hard, hydrogenated diamond-like carbon coatings on substrates.

BACKGROUND OF THE INVENTION

Hard, hydrogenated diamond-like carbon (DLC) films have received considerable attention due to their unique properties, which are close to those of diamond. Their high hardness, chemical inertness, optical transparency, and high electrical resistivity provide DLC films a strong potential for high-technological applications, such as hard, transparent optical coatings and protective scratch-resistant coatings. Currently, DLC films are prepared either from solid sources (vacuum plasma arc, ion beam sputtering, etc.) or from glow-discharge techniques using hydrocarbon arc, ion beam sputtering, etc.) or from glow-discharge techniques using hydrocarbon gases (direct current (dc)), radio frequency (rf), microwave and electron cyclotron resonance (ECR), with the substrates on the cathode). See, e.g., Y. Catherine *DIAMOND AND DIAMOND-LIKE FILMS AND COATINGS*, NATO ASI Series B, Vol. 266, Eds. R. E. Clausing et al. (Plenum Press, New York (1991), pages 193 ff.

Other techniques for generating DLC are mass-selected ion beam deposition, filtered vacuum arc deposition, plasma beam deposition, and plasma source ion implantation (PSII).

Unlike these methods, plasma immersion ion processing (PIIP), which combines the advantages of ion-beam-assisted deposition and plasma source ion implantation, is well-suited for producing conformal growth of DLC films. The PIIP technique is capable of producing solid films using high-density plasmas, at low substrate temperatures, and with independent control of ion energy. Non-line-of sight depositions are also possible.

In "Amorphous Diamond Films," U.S. Pat. No. 5,763,087, which issued to Steven Falabella on Jun. 9, 1998, the generation of amorphous diamond films on cooled, negatively rf-biased substrates using a cathodic arc source for producing a carbon ion beam from a graphite cathode is described. Intrinsic stress of the amorphous diamond coatings is reported to have been significantly reduced (1-2 GPa), thereby providing a more durable coating on substrates. Amorphous diamond is an electrically insulating, inert, transparent allotrope of carbon. It lacks long-range ordered structure, contains little or no hydrogen, and is characterized by extraordinary hardness. By contrast, DLC is hydrogenated and softer than amorphous diamond.

Plastic materials such as PMMA (polymethyl methacrylate) are inexpensive, colorless and optically transparent materials. PMMA can be fabricated into optical components such for watch crystals or camera lenses, for commercial applications. The processing cost is low. However, PMMA is very soft and susceptible to scratching and thermal distortion.

Accordingly, it is an object of the present invention to provide a method for enhancing the surface hardness and wear resistance of substrates without deterioration of the optical properties thereof.

Another object of the invention is to provide a method for generating hard, well-bonded coatings on substrates having complex shapes at low temperature.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

To achieve the foregoing and other objects, and in accordance with the purposes of the present invention, as embodied and broadly described herein, the method for forming an adherent, optically transparent, scratch-resistant diamond-like coating on a substrate hereof includes the steps of: applying a negative-pulsed bias voltage to the substrate, and immersing the biased substrate in a plasma containing ions simultaneously bearing carbon and hydrogen, whereby the ions are projected onto the surface of the substrate and form an optically transparent, scratch-resistant diamond-like coating on the surface thereof.

Preferably, the plasma is formed in a gas mixture of acetylene and an inert gas.

It is preferred that the inert gas includes argon.

In another aspect of the present invention, in accordance with its objects and purposes, the method for forming an adherent, optically transparent, scratch-resistant diamond-like coating on a substrate hereof includes the steps of: applying a negative-pulsed bias voltage to the substrate, and immersing the biased substrate in a plasma containing ions simultaneously bearing carbon and hydrogen, and ions bearing a dopant species, whereby the ions are projected onto the surface of the substrate and form an optically transparent, scratch-resistant diamond-like coating on the surface thereof.

Preferably, the plasma is formed in a gas mixture of acetylene, a doping gas and an inert gas.

It is preferred that the inert gas includes argon.

It is also preferred that the dopant species include boron and silicon and that the doping gas includes diborane ($B_2H_6$) or silane ($SiH_4$), respectively.

Benefits and advantages of the present method include: (1) the maintenance of low substrate-processing temperatures which allows treatment of temperature-sensitive material such as plastics; (2) the use of rf inductive plasmas having high ion density which allows treatment of complicated shapes; and (3) the use of relatively low processing pressures which permits extensive plasma formation and the simultaneously processing of large areas or a large number of small components, in the production of optically transparent films having high hardness, excellent resistance to wear, and low stress.

BRIEF DESCRIPTION OF THE DRAWINGS

The accompanying drawings, which are incorporated in and form a part of the specification, illustrate an embodiment of the present invention and, together with the description, serve to explain the principles of the invention. In the drawings:

FIG. 12a illustrates the variation of the hardness and stress as a function of boron doping in DLC, while FIG. 12b illustrates the variation of optical band gap and refractive index as a function of boron doping in DLC.

FIG. 13a shows the variation of the hardness and stress as a function of silicon doping in DLC, while FIG. 13b shows the variation of the optical band gap and refractive index as a function of silicon doping in DLC.

DETAILED DESCRIPTION

Briefly, the present invention includes the use of Plasma Immersion Ion Processing (PIIP) using inductively coupled plasma generation, in a $C_2H_2$-Ar gas mixture to generate optically transparent, high-hardness diamond-like carbon (DLC) films on metals, plastics, such as polymethyl methacrylate (PMMA), and glass substrates which are negatively pulse biased. The maximum hardness was observed to be about 30 GPa and the compressive stress was 9 GPa at pulsed -bias voltage of −150 V(carbon energy of 80 eV) and a chamber pressure of 0.04 Pa. DLC films synthesized in the bias range of −(100–200) V exhibited clear $sp^3$ bonding structures, low hydrogen contents, and high mass density. The DLC films were found to have high hardness (>22 GPa) and refractive indices of approximately 2. Lowering the bias to −70 V or less induces the formation of carbon films with high hydrogen content, high optical band gap, and very low hardness. A negative bias of −100 V was found to be an important low threshold energy condition for deposition of DLC films with excellent optical properties. DLC films formed at a bias value of −100 V exhibited high optical gaps (≈1.90 eV), refractive indices of approximately 1.87, and low optical absorption coefficients. Film thicknesses ranged between 100 and 400 nm.

The process uses inductively coupled rf sources to generate a plasma from a mixture of argon and acetylene gases. Negative voltage pulses are used to extract positive ions from the plasma to bombard and deposit the DLC film. This plasma-based process can be scaled-up to simultaneously treat large areas (many square meters) consisting of large single components or collections of many small components. The components can have complicated surface geometries.

Doping the DLC with boron or silicon using $B_2H_6$ or $SiH_4$ as part of the plasma gas improves the optical transmission response of the coatings and significantly reduces coating stress. However, coating hardness is slightly reduced. The PIIP process at low-energy ion bombardment has been demonstrated to generate B- or Si-doped DLC films having improved optical transmittance on PMMA, glass and Polycarbonate. As will be described hereinbelow, boron doping of DLC between 4 and 8 atom percent produces coatings having hardnesses of between 27 and 29 GPa, coating stress levels that are more than 40% less than those for undoped DLC, optical gap energies of 2.2 eV, and refractive indices between 2.2 and 2.4 for film thicknesses between 100 and 400 nm. Incorporating silicon into DLC at level less than 17 atom percent produces coatings having hardnesses of between 26 and 28 GPa, coating stress levels that are more than 60% less than those for undoped DLC, and optical gap energies between 2 and 2.17 eV.

In the following description, intrinsic film stress was determined using the substrate curvature method. The curvature of the substrate was measured before and after deposition by laser scanning (see, e.g., C. A. Volkert, J. Appl. Phys. 70, 3521 (1991)), and stress was calculated using the Stoney equation (see, e.g., G. G. Stoney, Proc. Roy. Soc. (London) A82, 172 (1909)):

$$\sigma = \frac{Et^2}{6h}\left(\frac{1}{R_d} - \frac{1}{R_s}\right),$$

where σ is the stress, E is the biaxial modulus of the substrate, t is the substrate thickness (~380 μm for the wafers used), h is the film thickness, and $R_d$ and $R_s$ are the radii of curvature after and before deposition, respectively. Silicon substrates were used in the hardness, stress and refractive index measurements, while band gaps were measured on PMMA substrates.

Figure 1:
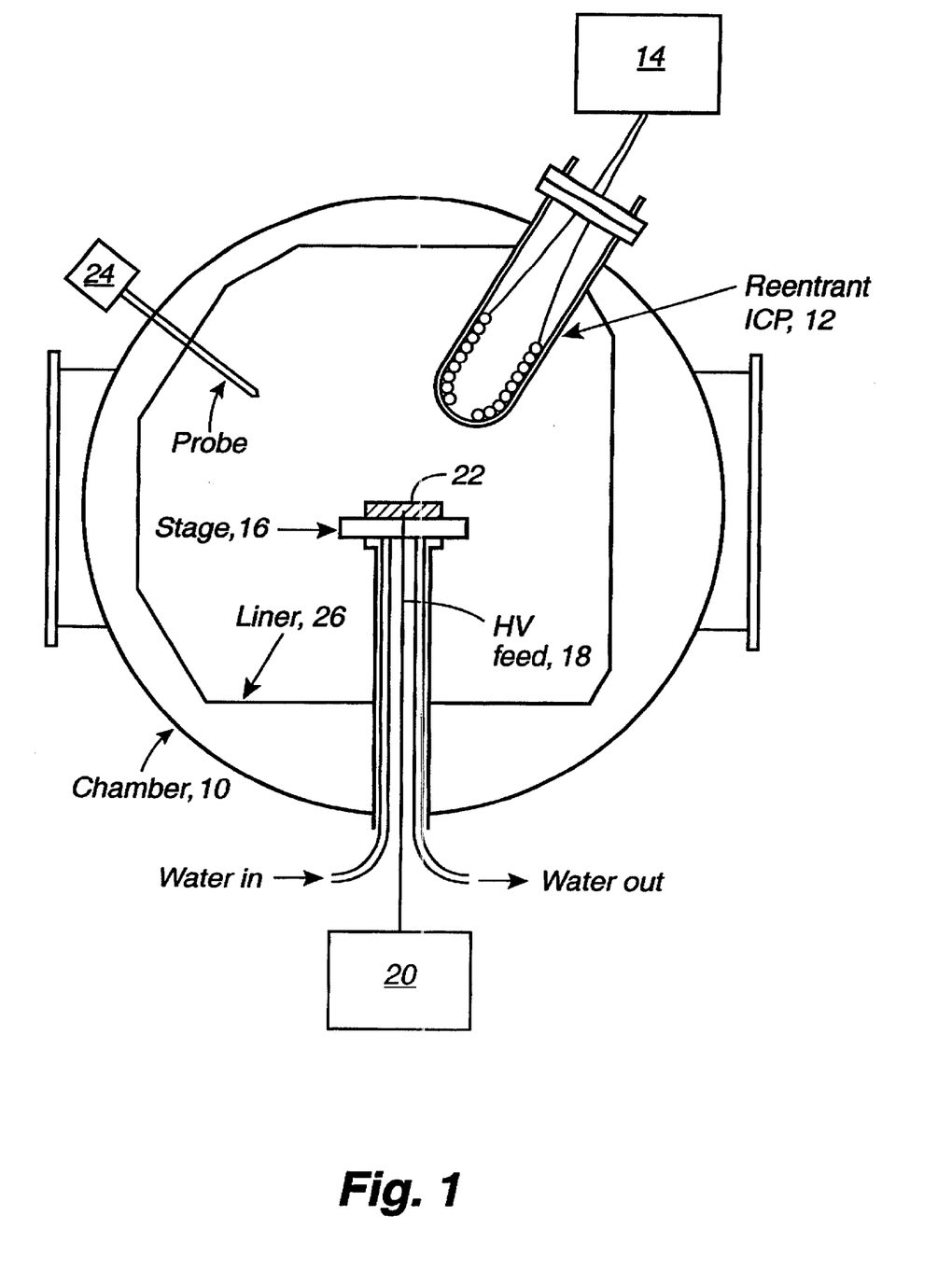
FIG. 1 is a schematic representation of an end view of the apparatus used to perform the method of the present invention showing, in particular, the location of the reentrant inductively coupled plasma generator inside of the vacuum chamber and in the vicinity of the sample.

Reference will now be made in detail to the present preferred embodiment of the invention examples of which are illustrated in the accompanying drawings. Turning now to FIG. 1, a schematic representation of an end view of the apparatus used to perform the method of the present invention is shown. The PIIP deposition system includes a stainless steel, high-vacuum cylindrical vacuum chamber (Ø01.2 m×1.8 m), 10, equipped with a reentrant inductively coupled plasma source (generates ion densities of $10^{10}$ cm$^{-3}$ at 150 W rf power input), 12, which is powered by a 0.46 MHz rf source, 14. Water-cooled substrate holder, 16, was biased with a negative voltage of between 1 V and 1000 V at 1 kW maximum average power by and insulated-gate, bipolar transistor, pulsed-bias modulator, 20. The bias pulse width was typically 20 $\mu$s and the pulse frequency was 10 kHz. A base chamber pressure below $1.3 \times 10^{-4}$ Pa was achieved using a turbomolecular pump, backed by a rotary mechanical pump (not shown in FIG. 1). Uniform thin films having thicknesses between 100 and 400 nm were deposited over an area of about 840 cm$^2$ at temperatures close to ambient using this apparatus.

Typically, substrate, 22, was cleaned prior to coating using the following procedure: glass and Si(100) wafers employed were first cleaned in an acetone, then with PMMA in an ethanol bath, and finally ultrasonically rinsed with distilled water. Prior to film growth substrates were subjected to an Ar$^+$ sputter cleaning using a $-600$ V pulsed bias and the incident dose of $5 \times 10^{16}$ cm$^2$ to remove any residual contaminants or surface oxides. During the DLC generation, the reactant stream was a mixture of pure C$_2$H$_2$ and pure Ar used in a flow ratio of C$_2$H$_2$ to Ar (or $F_{C2H2}/F_{AR}$) equal to 0.2. The reactant pressure was varied between 0.04 and 0.93 Pa. The films were synthesized with bias voltages between $-70$ V and $-300$ V. The film thickness during the growth was monitored in-situ using a laser interferometer, not shown in FIG. 1. Plasma densities, electron temperatures, plasma potentials, and electron energy distribution functions were measured using a cylindrical Langmuir probe, 24. An aluminum liner, 26, is used to protect the chamber walls from contamination.

Having generally described the invention, the following EXAMPLES provides additional details thereof.

EXAMPLE 1

Figure 2:
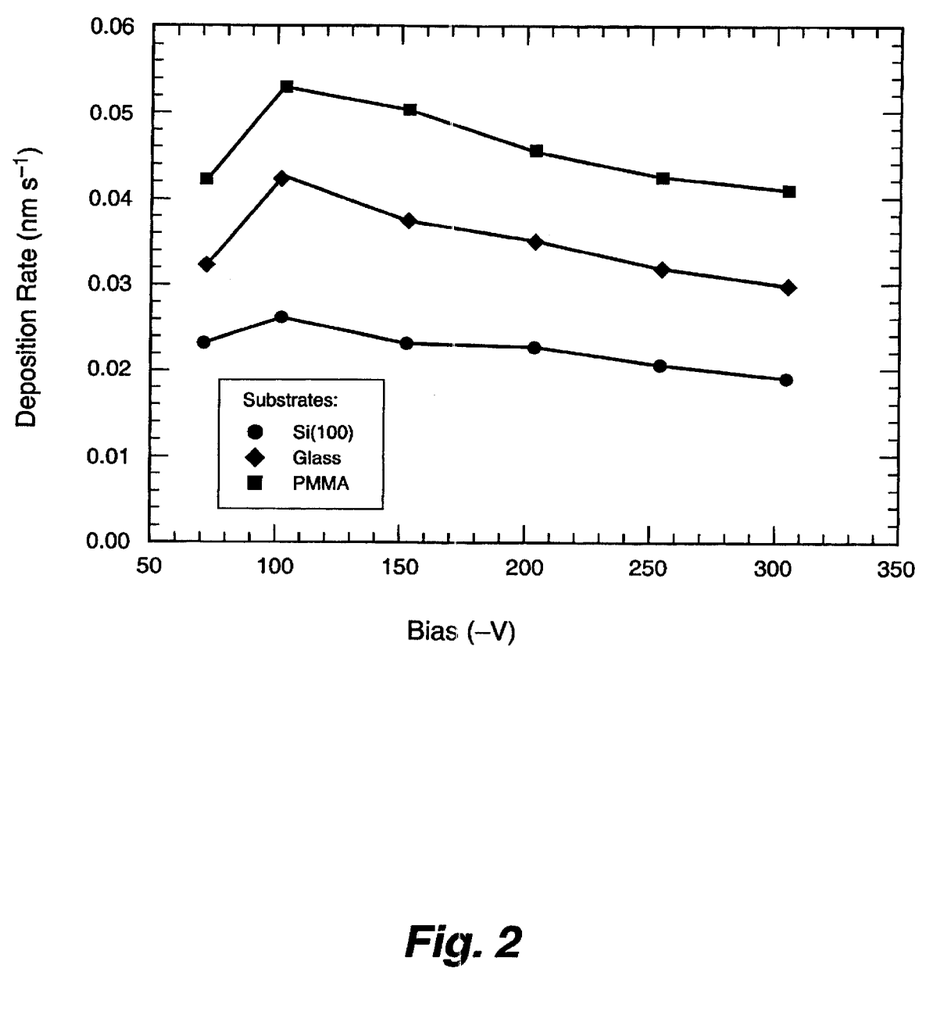
FIG. 2 is a graph showing the rates of deposition of diamond-like carbon (DLC) films prepared according to the method of the present invention as a function of sample pulsed bias voltage for several substrates.

The thickness of undoped DLC films generated in accordance with the teachings of the present invention was between 100 and 300 nm, and the films were visually observed to be smooth and flat. No grain features were observed under investigation using a scanning electron microscope (SEM). FIG. 2 shows the dependence of the film growth rate on the substrate pulse bias voltage for three different substrates. From FIG. 2 it may be observed that the deposition rate increases with an increase in negative bias voltage, reaching a maximum at $-100$ V, and then decreases slowly at higher negative biases. In addition, the growth rates of DLC films on different substrates are different. FIG. 2 also shows that the growth rates of DLC films on PMMA and glass are higher than that on Si (100) wafers. It is believed by the present inventors that the different insulating properties of the substrates may affect the growth rate of DLC films in PIIP.

Figure 3:
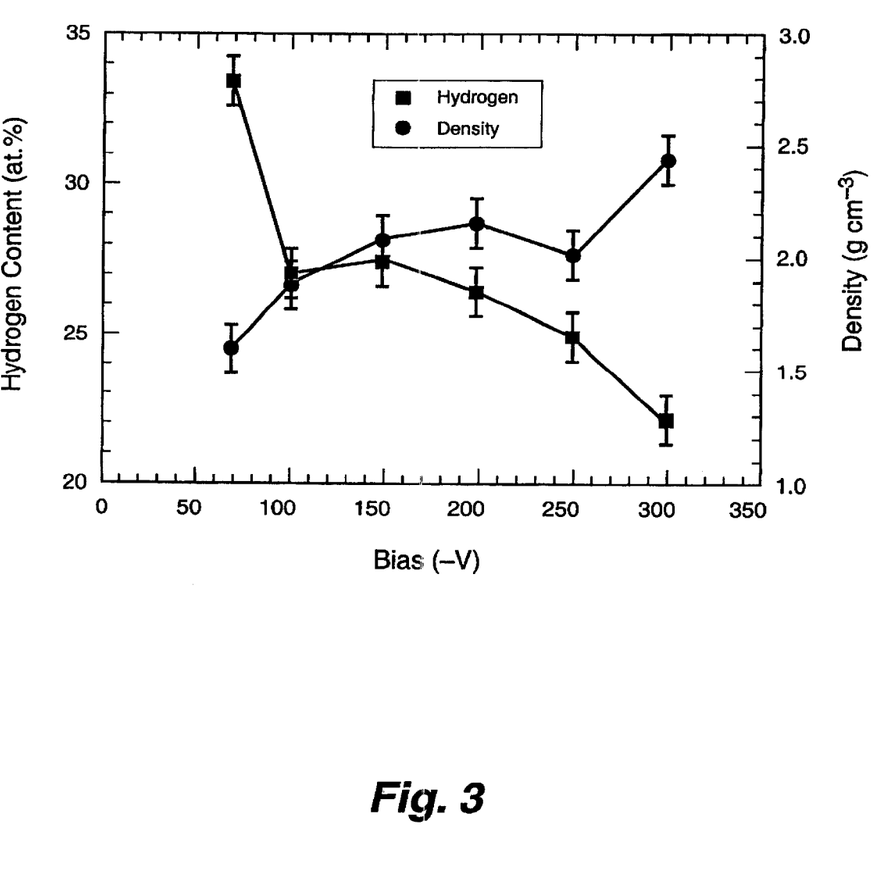
FIG. 3 is a graph of the hydrogen content of the DLC film and the density of DLC films as a function of bias voltage.

The hydrogen content and density of DLC films prepared on Si (100) wafers at various biases are shown in FIG. 3. By increasing the negative bias voltage, from $-70$ V to $-300$ V, the hydrogen content was observed to diminish from 33 atom percent to 22 atom percent, while the film density increases from 1.6 g cm$^{-3}$ to 2.5 g cm$^{-3}$. FIG. 3 also shows that films synthesized at $-70$ V have a high hydrogen content of 33.5 atom percent and a low density of 1.60 g cm$^{-3}$. These data indicate that when the bias is kept between $-100$ V and $-200$ V, the resultant DLC films exhibit a relatively stable hydrogen content of $27.0\pm0.5$ atom percent and a density of $2.05\pm0.10$ g cm$^{-3}$.

Figure 4:
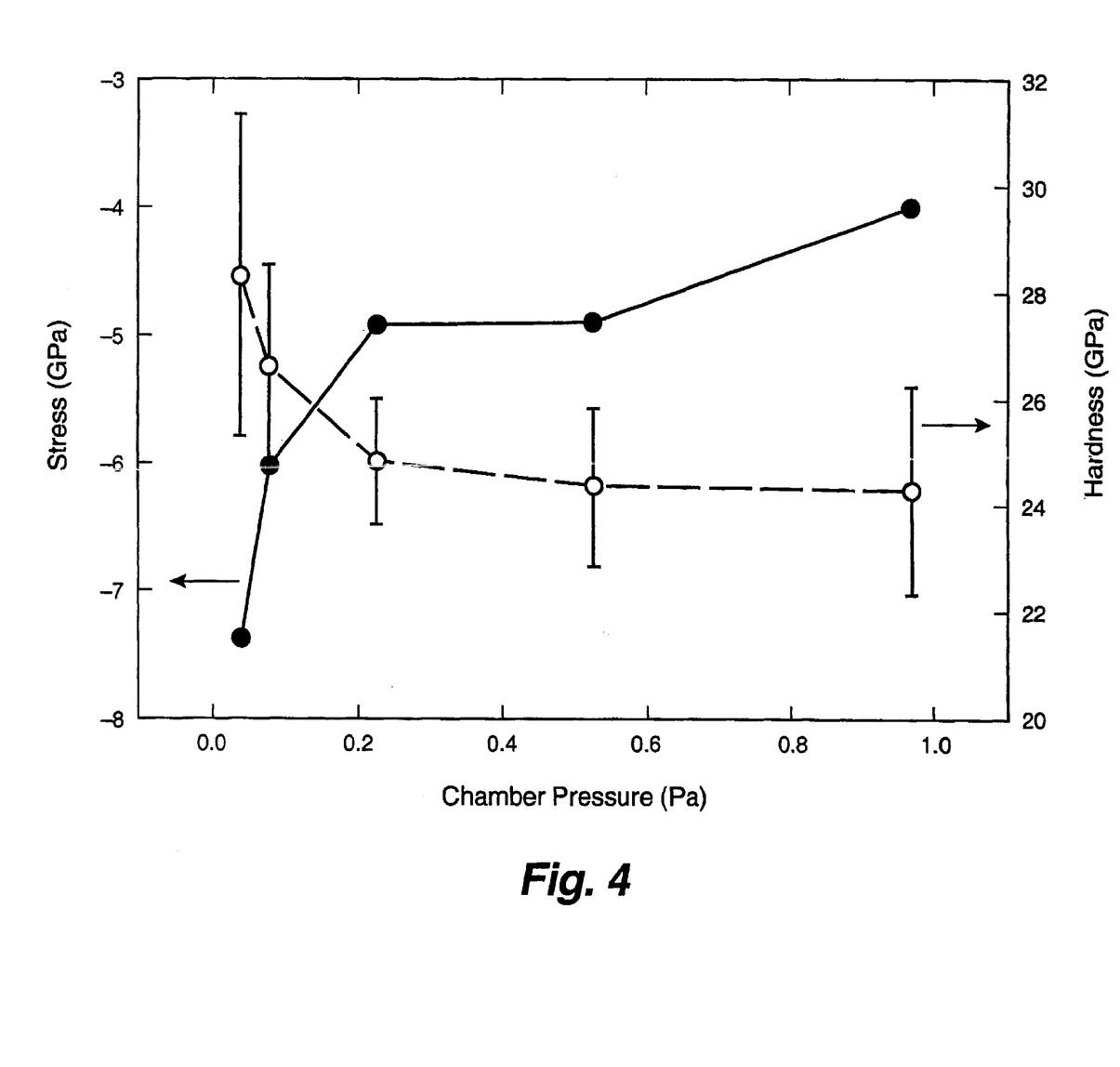
FIG. 4 is a graph of the stress (solid circles) and hardness (open circles) of DLC films as a function of chamber pressure, and illustrates that minimum stress and maximum hardness were obtained at the lowest gas pressure employed (0.04 Pa).

FIG. 4 shows how DLC film stress and hardness change with gas pressure. The maximum magnitude of the compressive stress and maximum hardness were observed at the lowest pressure of 0.04 Pa. Higher gas pressure during processing resulted in greater ion scattering and broadening of the ion energy distribution (IED). Ions in the low-energy portion of the IED generate graphitic carbon bonds having poor surface adhesion. In FIG. 4, the argon-to-acetylene ratio was 5:1 and the pulsed-bias voltage was $-200$ V. Compressive stress values were between 4 GPa and 7.5 GPa which corresponds to nanoindentation hardness values of between 24 GPa and 28 GPa. Nanoindentation hardness values were obtained at a depth of 50 nm from the surface, and film thicknesses ranged from about 100 nm to 300 nm.

Figure 5:
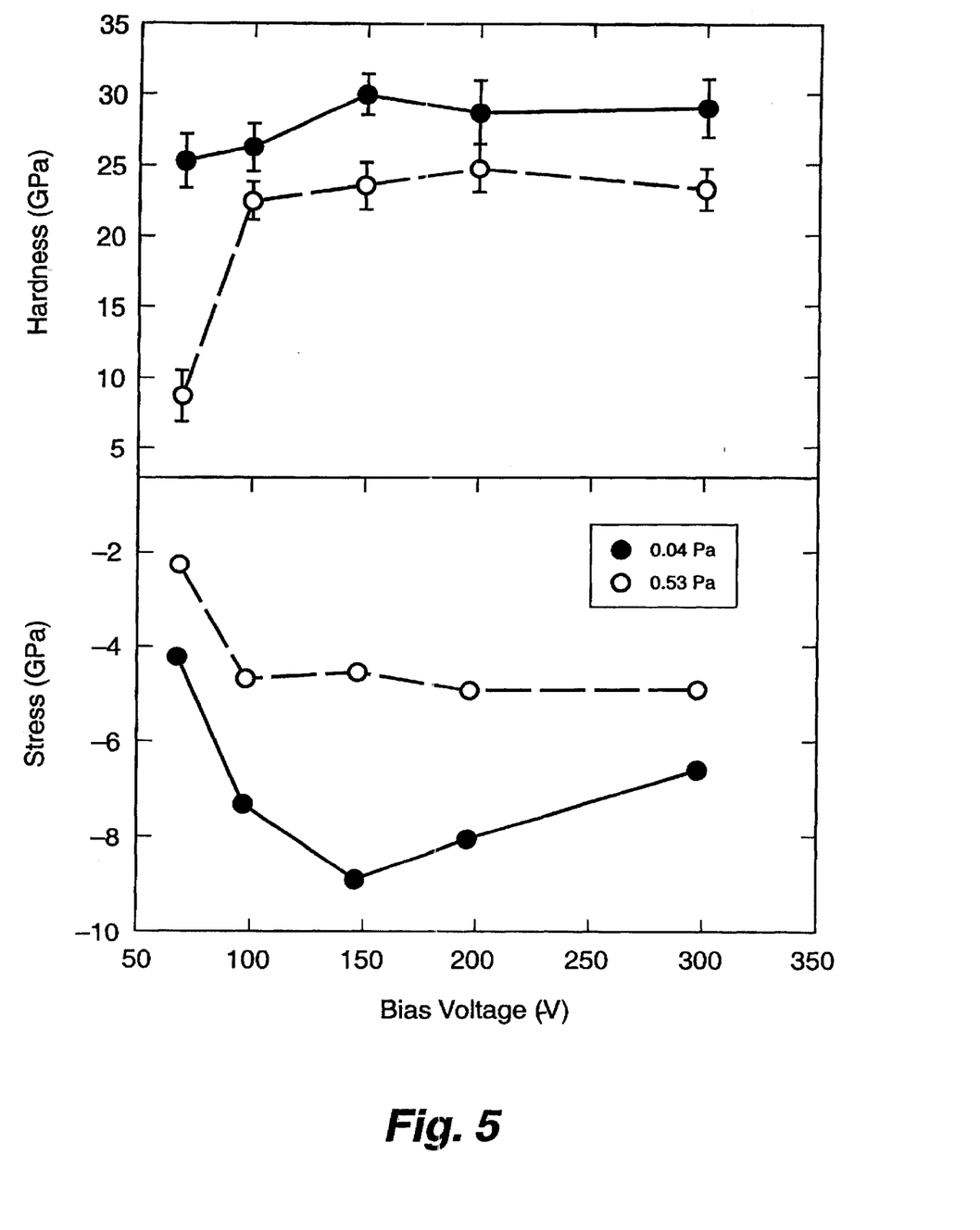
FIG. 5 is a graph of the stress and hardness of DLC films as a function of sample pulsed-bias voltage for two chamber pressures, the pulsed-bias of −150 V which gives the best hardness and stress characteristics corresponds to carbon energy of 80 eV.

FIG. 5 shows the affect of bias voltage on film hardness and stress at two pressures. At higher gas pressure, the film adhesion was poor, the stress was less compressive and the hardness lower than those properties for DLC films deposited at lower gas pressures.

Figure 6:
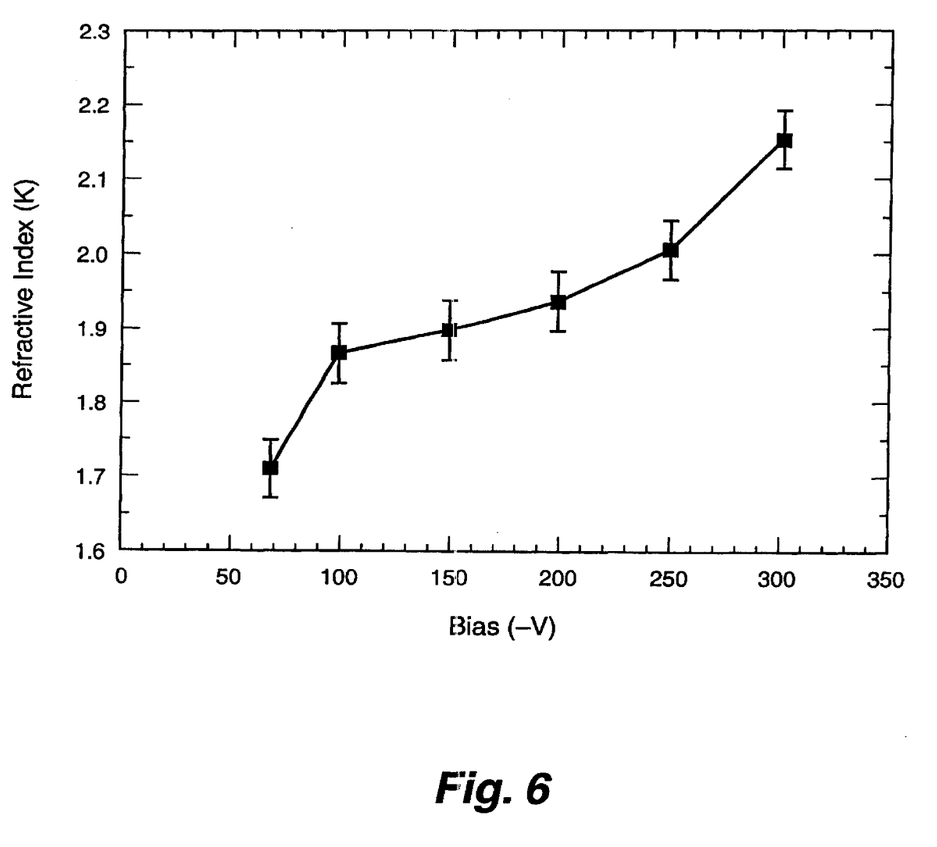
FIG. 6 is a graph of the refractive index of the DLC films as a function of the sample pulse-bias voltage.

FIG. 6 shows the refractive index of DLC films as a function of negative bias voltage. The refractive index is shown to increase from 1.71 at $-70$ V bias to 2.16 at $-300$ V. The refractive index also reaches the approximately constant value of between 1.87 and 1.95 for films prepared in the bias range of between $-100$ V and $-200$ V. From FIG. 3 and FIG. 6, it can be observed that as the negative bias is increased, the refractive index and film density both increase. A reduction of the bias to $-70$ V would deteriorate the quality of the films which exhibit high hydrogen content, low density and low refractive index.

Figure 7:
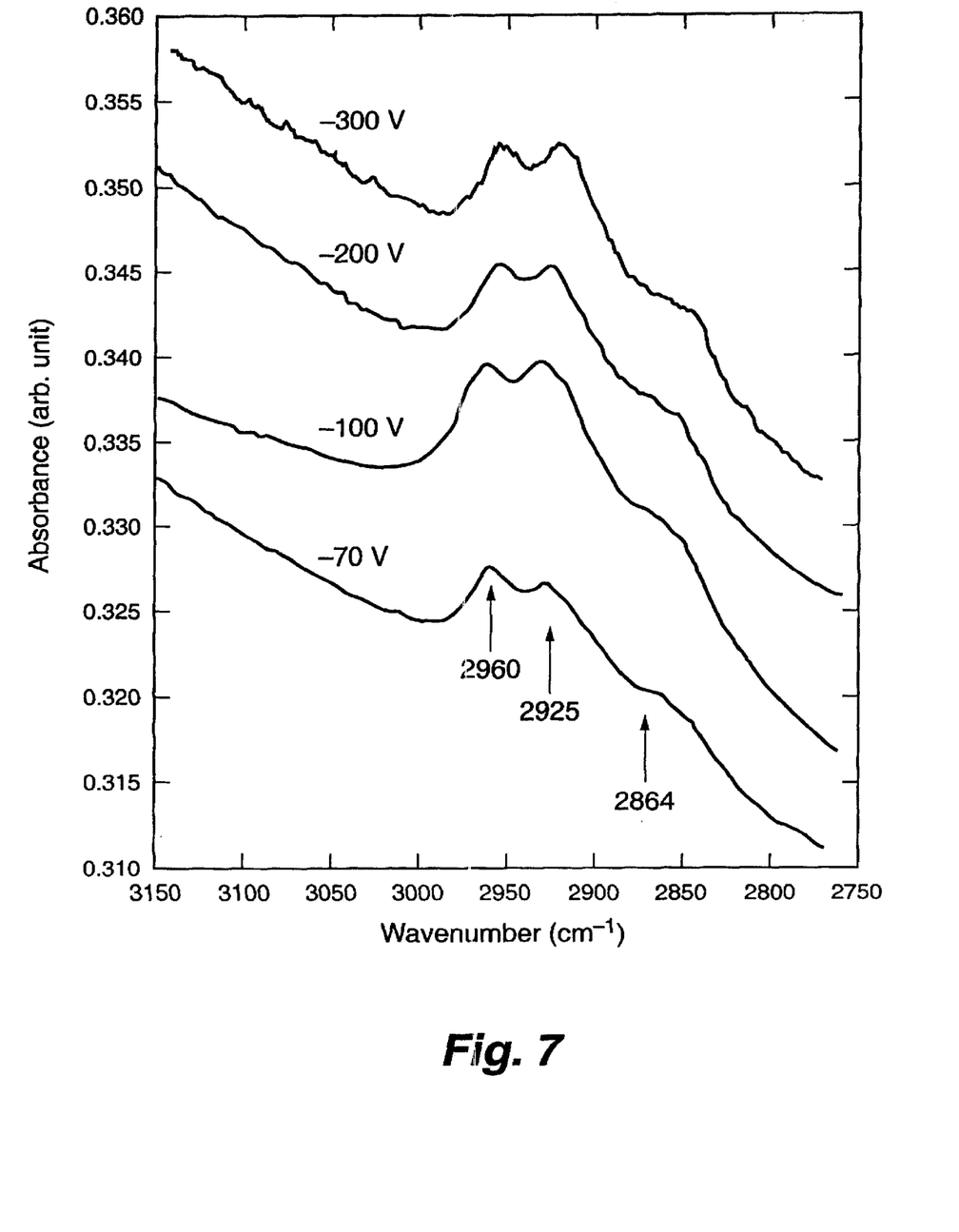
FIG. 7 shows FT-IR absorbance spectra of the DLC films as a function of wavenumber for sample pulsed-bias voltages of −300 V, −200 V, −100 V, and −70 V.

FIG. 7 shows Fourier transform infrared (FTIR) spectra of DLC films deposited on glass at various substrate biases. The absorption peaks at 2864 cm$^{-1}$, 2925 cm$^{-1}$ and 2960 cm$^{-1}$ correspond to Sp$^3$ CH$_3$ (symmetrical), sp$^3$ CH$_2$ (asymmetrical), and Sp$^3$ CH$_3$ (asymmetrical) vibration modes, respectively. No Sp$^2$ CH$_2$ absorption peak is observed in the FTIR spectra. These data show that under constant gas flow ratio ($F_{C2H2}/F_{AR}$=0.2), negative bias voltages higher than $-70$ V lead to the formation of DLC films with common sp$^3$ bonding features, as indicated by the three IR peaks as 2864 cm$^{-1}$, 2925 cm$^{-1}$, and 2960 cm$^{-1}$ in FIG. 7. The data also show that films produced at negative bias voltages less than or equal $-70$ V contain lower concentrations of C—H sp$^3$ bonds as is indicated by the substantially lower absorption intensity at 2864 cm$^{-1}$, 2925 cm$^{-1}$, and 2960 cm$^{-1}$. The IR spectra in FIG. 7 indicate that by decreasing the negative bias voltage from $-300$V to $-100$ V, the peaks at 2864 cm$^{-1}$, and 2960 cm$^{-1}$ all become smaller with respect to a principal peak at 2925 cm$^{-1}$, possibly indicating a higher sp$^3$ bonding fraction at a negative pulse-bias of $-100$ V.

Figure 8:
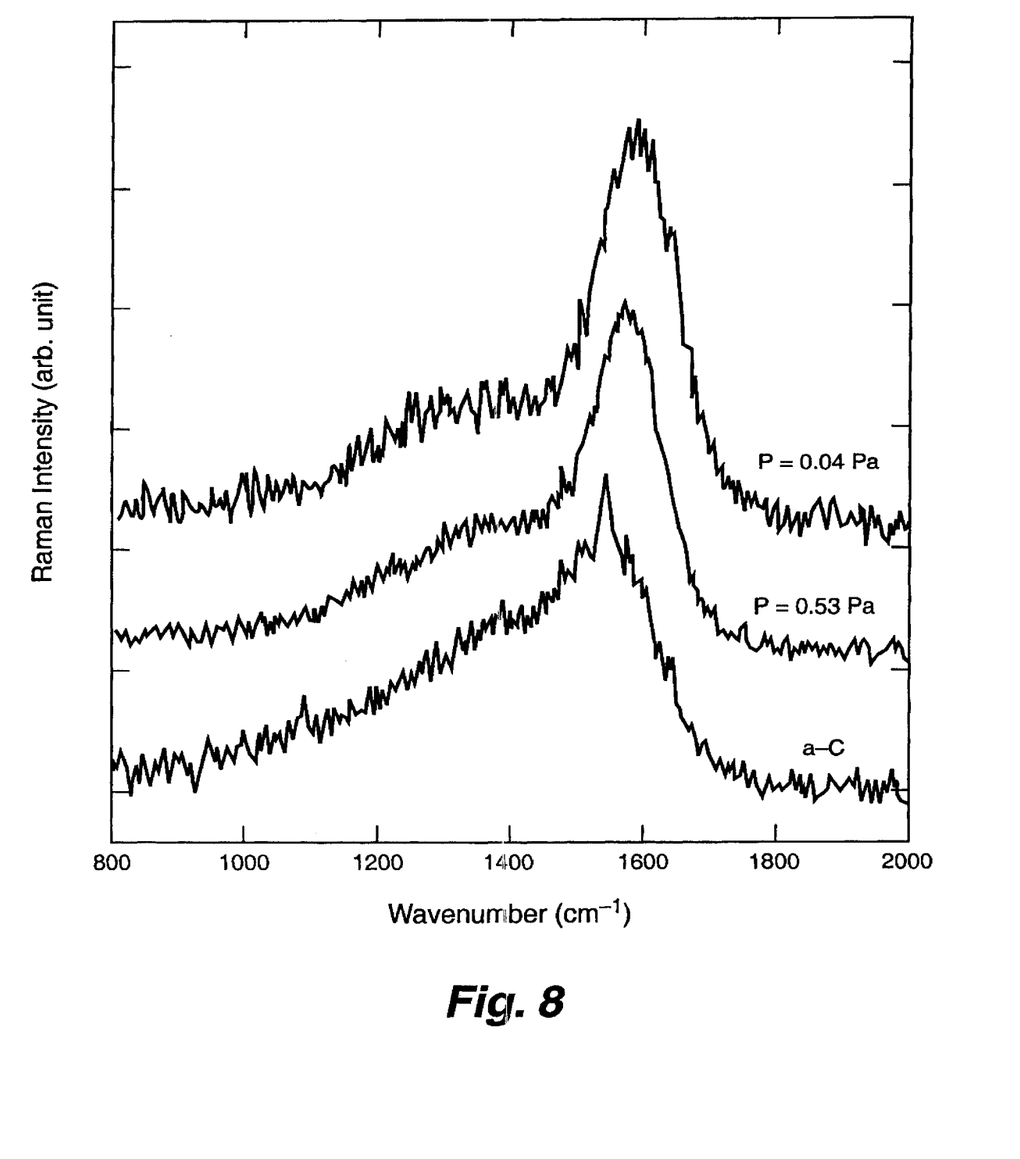
FIG. 8 shows UV (262 nm laser light)/Raman spectra of DLC films prepared at two pressures and that amorphous carbon as a function of wavenumber.

Film characterization by Raman spectroscopy and shown in the spectra of FIG. 8 indicate that films deposited between '100V and $-300$V bias voltage have the typical structure characteristics of DLC. The films are identified by their deposition pressures. For comparison, the spectrum of an amorphous carbon film deposited by pulsed laser ablation under conditions that favor formation of sp$^2$ (three-fold-coordinated) carbon is shown ("a–C"). The peak shift from 1570 cm$^{-1}$ (P=0.53 Pa) to 1590 cm$^{-1}$ (P=0.04 Pa) implies a higher content of sp$^3$-carbon bonds. With UV-excitation and in the context of the growth conditions and the physical properties of these films, the appearance of a relatively low-frequency shoulder (~1250 cm$^{-1}$) in the P=0.04 Pa films suggests an enhanced fraction of sp$^3$-carbon bonding, rather than an sp$^2$-bonded structure. The higher frequency shoulders (1350–1400 cm$^{-1}$) in the other two films indicate the presence of extended sp$^2$-bonded structures.

Figure 9:
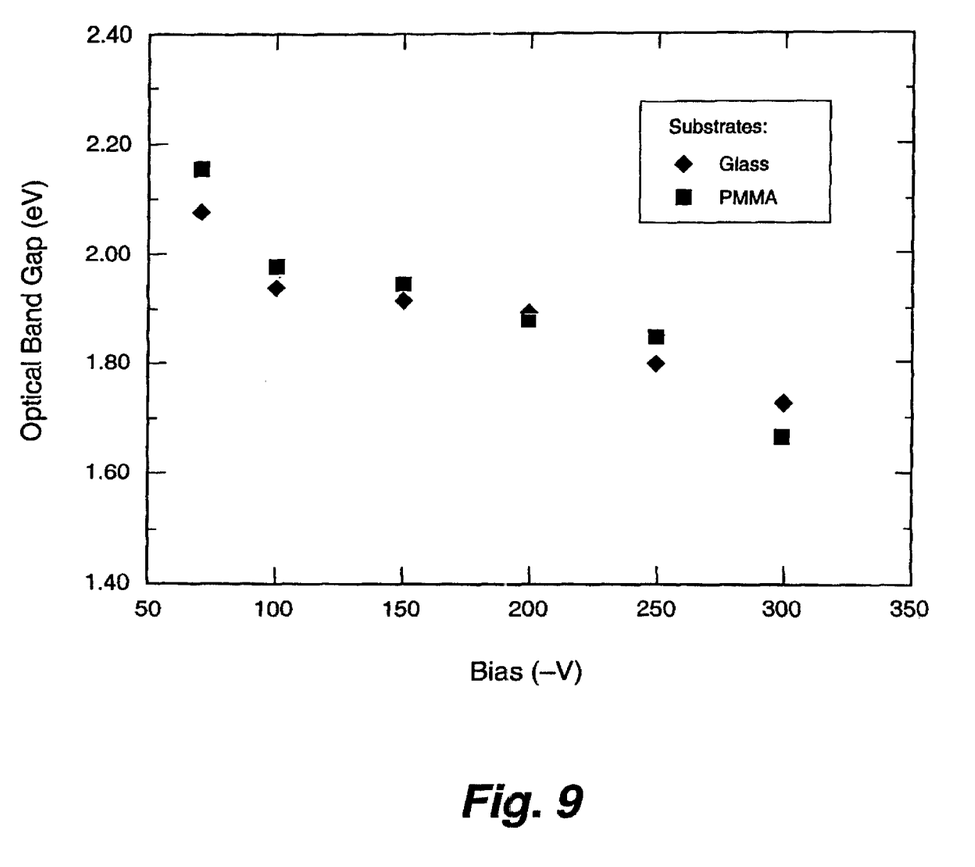
FIG. 9 is a graph of the optical band gap of the DLC films as a function of sample pulsed bias voltage.

For the optical investigation of generated films, absorption coefficients calculated from the optical absorbency and thickness of the DLC films, were used to evaluate the optical transparency of the films. The optical band gap of DLC films formed at various bias voltages is shown in FIG. 9. These data were obtained by fitting the absorption coeffecients to the Tauc relation and extrapolating the linear portion of the Tauc curves towards the abscissa. See, e.g., J. Robertson, Surface and Coatings Technology 50, 185 (1992). FIG. 9 shows that the optical gap energy decreases monotonically with increasing negative substrate bias. However, for DLC films synthesized at biases of between −100 V and −200 V, the optical band gaps on PMMA and glass are very similar with values between 1.95 to 1.86 eV. This implies that the films formed in bias the range of between −100 V and −200 V possess stable optical properties despite their formation on different substrates. The films formed at higher biases, −250 to −300 V, exhibit relatively small band gaps, and high absorbance.

Hydrogen content, density and optical properties of DLC films were found to exhibit a substantial dependence on the pulsed-bias. A bias voltage of −70 V was too low to generate ion impingement with sufficient energy to deposit $sp^3$-bonded carbon atoms and to effectively re-sputter hydrogen atoms out of the film. The resultant films possessed optical band gaps greater than 2.1 eV, a low density of 1.6 and a low hardness of 8 GPa. When the applied bias was larger than −250 V, the resultant DLC films exhibited high absorption coefficients and a relatively low optical gap energy of between 1.68 eV and 1.84 eV. Thus, the PIIP synthesis of DLC films with optimal optical properties requires a bias voltage in the region between −100 V and −150 V. DLC films formed under these conditions exhibit low hydrogen content, high density, and good optical properties. Therefore, a bias voltage of −100 V is the low-energy threshold for ion bombardment for PIIP synthesis of an optical DLC coating, since bias voltage equal to or larger than −100 V produce films exhibiting a significant reduction of hydrogen content, from about 27 at. %, and concurrent increase of film density, from 1.98 g cm$^{-3}$, and hardness above 22 GPa. In addition, the films deposited at bias voltages of −100 V exhibited the lowest absorption coefficients and a high optical band gap of around 1.90 eV.

EXAMPLE 2

Figure 10:
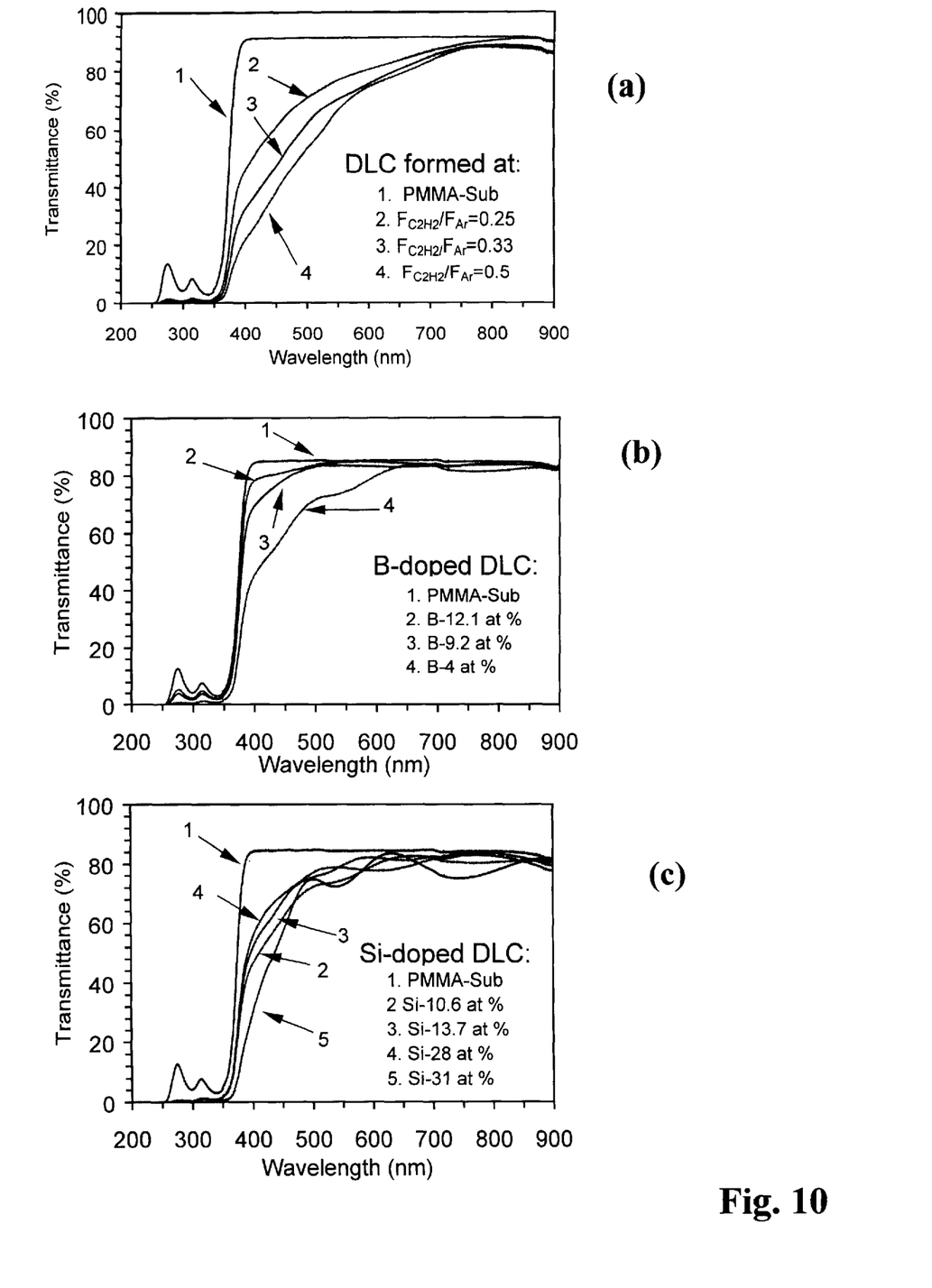
FIGS. 10a–c are graphs of the optical transmission as a function of wavelength for various DLC films synthesized under different conditions and with specified atomic dopings.

FIGS. 10a–10c are graphs of the optical transmission as a function of wavelength for various DLC films synthesized under different conditions and different doping levels on a PMMA substrate. The approximately 300 nm thick DLC coating illustrated FIG. 10a was formed at 1 mT gas pressure with $C_2H_2$ and Ar as the plasma gases, an rf power level of 400 W and a substrate bias of −150 V, and was determined to have a hydrogen concentration of between 25 and 33 atom percent. Curve 1 shows the transmission of the PMMA substrate, while curves 2–4 show transmissions of the resulting coatings when the ratio of $C_2H_2$ to Ar in the plasma gas is 0.25, 0.33 and 0.5, respectively. The approximately 300 nm thick DLC coating illustrated FIG. 10b was formed at 1 mT gas pressure with $C_2H_2$, $B_2H_6$ and Ar as the plasma gases, an rf power level of 400 W and a substrate bias of −200 V, and was determined to have a hydrogen concentration of between 28 and 38 atom percent. Curve 1 shows the transmission of the PMMA substrate, while curves 2–4 show transmissions of the resulting coatings when the boron atom weight percent is 12.1, 9.2 and 4, respectively. The approximately 320 nm thick DLC coating illustrated FIG. 10c was formed at 1 mT gas pressure with $C_2H_2$, $SiH_4$ and Ar as the plasma gases, an rf power level of 400 W and a substrate bias of −150 V, and was determined to have a hydrogen concentration of between 31 and 40 atom percent. Curve 1 shows the transmission of the PMMA substrate, while curves 2–5 show transmissions of the resulting coatings when silicon atom weight percent is 10.6, 13.7, 28, and 31, respectively. Wavelengths between 200 and 900 nm were investigated. It may be observed from the data that doping improves transmission in the wavelength range between 250 and 550 nm, with boron doping providing more improvement than silicon doping.

Figure 11:
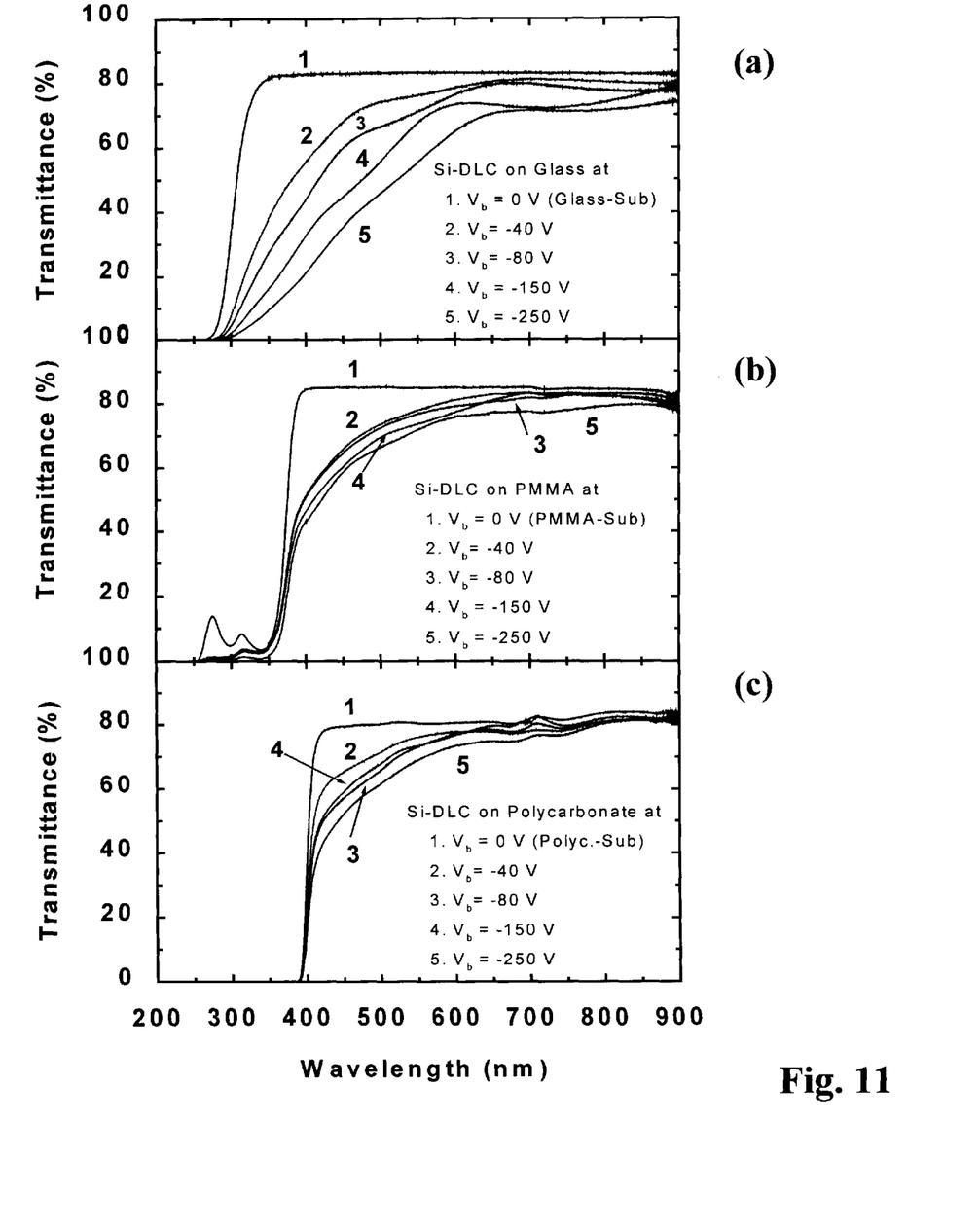
FIGS. 11a–11c show the optical transmission of silicon-doped DLC coatings on different substrates: glass (FIG. 11a), PMMA (FIG. 11b) and polycarbonate (FIG. 11c).

FIGS. 11a–11c show the optical transmission of silicon-doped DLC coatings on different substrates: glass (FIG. 11a), PMMA (FIG. 11b) and polycarbonate (FIG. 11c). Approximately 320 nm coatings were generated at 0.1 Pa gas pressure where the $SiH_4$ and $C_2H_2$ were mixed together at a ratio of 0.5 $SiH_4$ to $C_2H_2$ and introduced into the plasma at a flow rate of 6 sccm, while the Ar was introduced into the plasma at a flow rate of 12 sccm. In FIGS. 11 a–c, curve 1 represents the transmission of the substrate, while curves 2–5 represent the transmissions of the coatings formed when the substrates were biased at −40 V, −80 V, −150 V, and −250 V, respectively.

Figure 12:
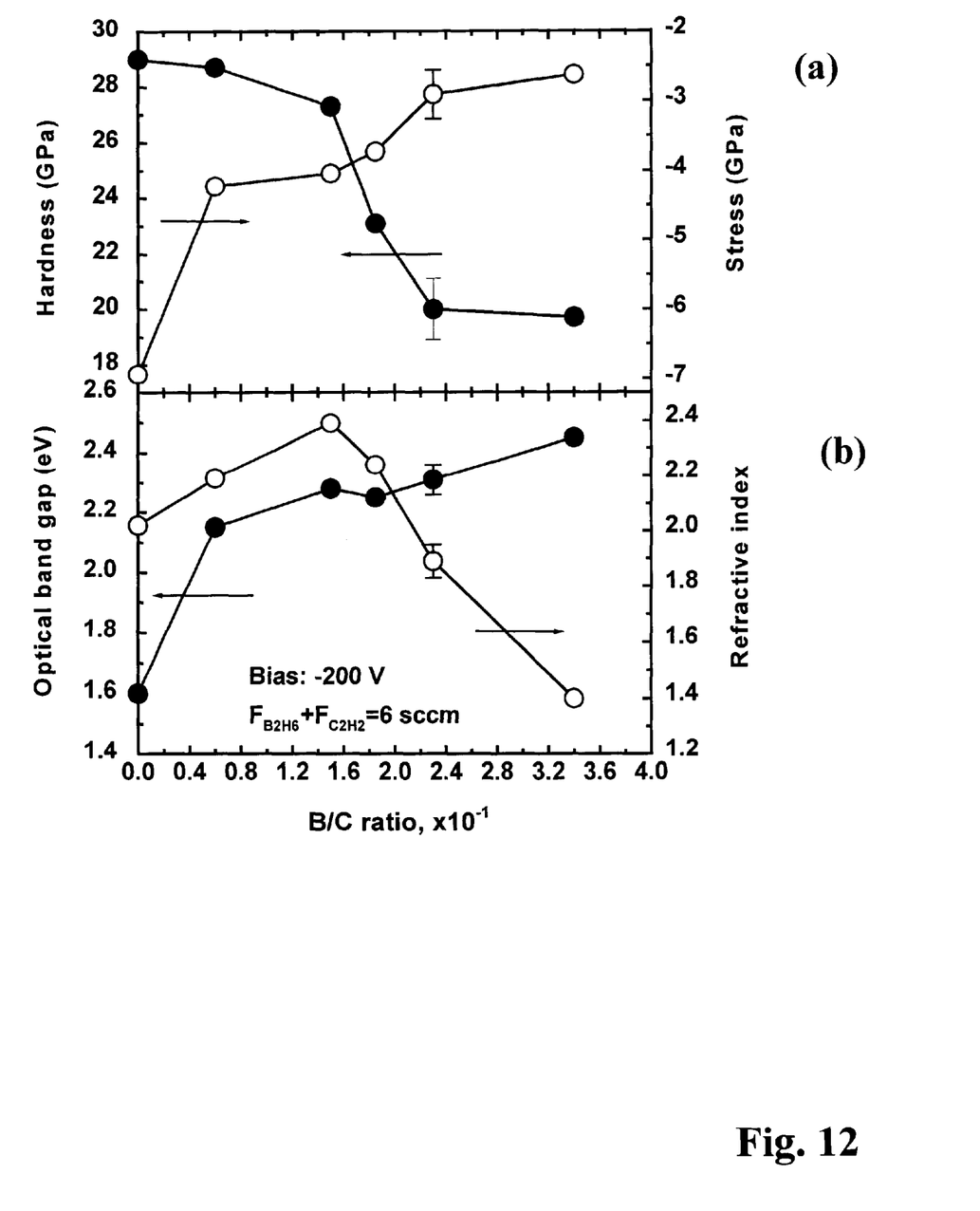

FIG. 12a illustrates the variation of the hardness and stress as a function of boron doping in DLC, while FIG. 12b illustrates the variation of optical band gap and refractive index as a function of boron doping in DLC. For B/C ratios in the range of 0.06–0.16 (4–8 atom percent B), the stress was reduced by greater than 40% (from −7 to −4.2 GPa), the hardness reduced by 6% (29 to above 27 GPa), the optical gap energy was about 2.2 eV, and the refractive index was between 2.2 and 2.4. Coatings were prepared with the substrate biased at −200 V and with a $B_2H_6$ and $C_2H_2$ mixture introduced into the plasma at a flow rate of 6 sccm. It may be observed from FIGS. 12a and 12b that boron doping of up to 8 atom percent improves the properties of the DLC.

Figure 13:
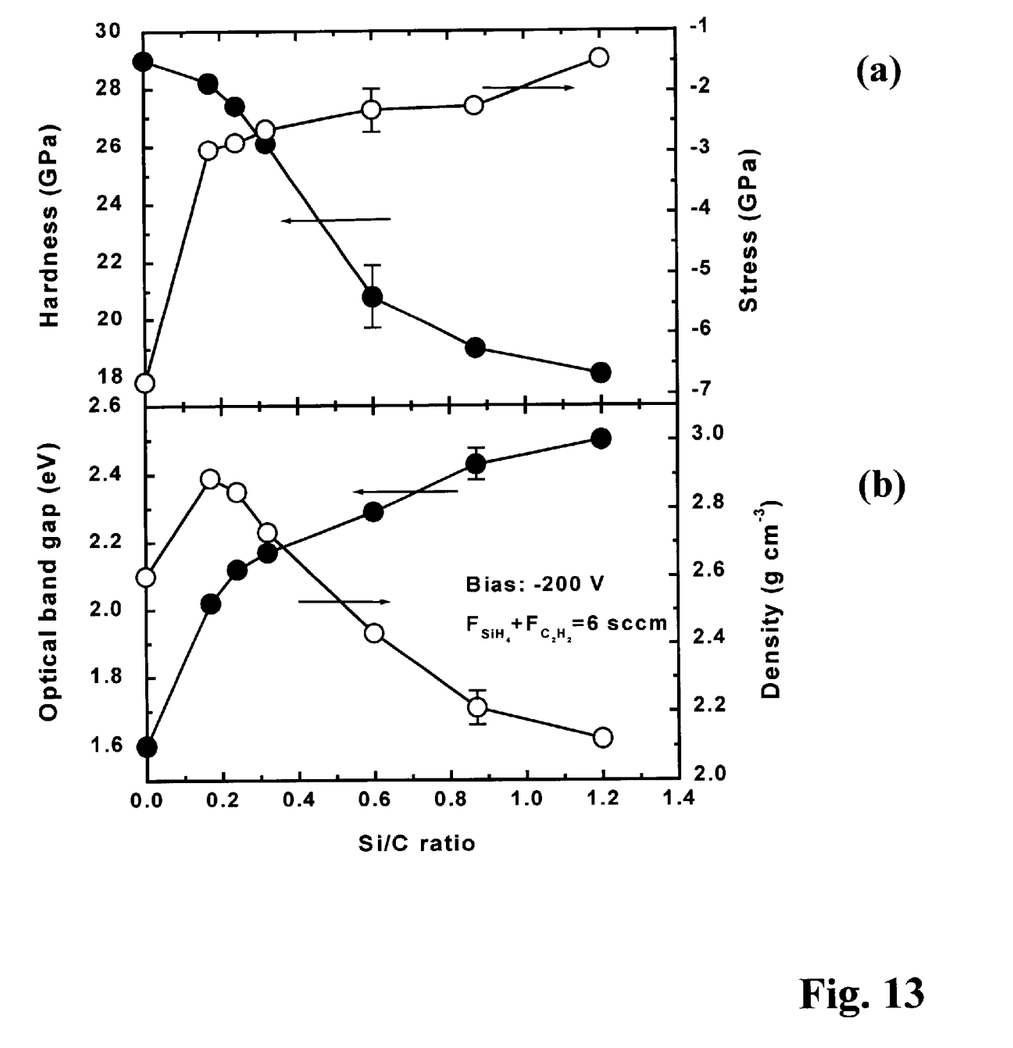

FIG. 13a shows the variation of the hardness and stress as a function of silicon doping in DLC, while FIG. 13b shows the variation of the optical band gap and refractive index as a function of silicon doping in DLC. For Si/C ratios between 0.17–0.32 (10–17 atom percent Si), the coating stress was reduced by a factor of 2 (from −7 to less than −3 GPa), the hardness was reduced by 9% (from 29 to about 26 GPa), the optical gap energy was about 2–2.17 eV, and the mass density was between 2.7 and 2.9 g/cm$^3$. Coatings were prepared with the substrate biased at −200 V and with a $SiH_4$ and $C_2H_2$ mixture introduced into the plasma at a flow rate of 6 sccm. It may be observed from FIGS. 13a and 13b that silicon dopings of less than 17 atom percent improves the properties of the DLC. For the data illustrated in FIGS. 12a, 12b, 13a and 13b, hardness, stress and refractive index measurements were made for coatings deposited on silicon substrates, while the band gap measurements were made using PMMA substrates.

The foregoing description of the invention has been presented for purposes of illustration and description and is not intended to be exhaustive or to limit the invention to the precise form disclosed, and obviously many modifications and variations are possible in light of the above teaching. For example, hydrocarbons other than acetylene can be used to produce acceptable DLC films according to the teachings of the present invention, as can other inert gasses.

The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A method for forming an adherent, optically transparent, scratch-resistant diamond-like coating on a substrate comprising the steps of:
   (a) applying a negative-pulsed bias voltage to said substrate; and
   (b) immersing the biased substrate in a plasma containing ions simultaneously bearing carbon and hydrogen, and ions bearing boron, whereby the ions are projected onto the surface of said substrate and form an optically transparent, scratch-resistant diamond-like coating on the surface thereof, wherein said coating contains 4–8 atom percent boron.

2. The method for forming an adherent, optically transparent, scratch-resistant diamond-like coating on a substrate as described in claim 1, wherein the plasma is formed in a gas mixture of acetylene, an inert gas and a gas containing boron atoms.

3. The method for forming an adherent, optically transparent, scratch-resistant diamond-like coating on a substrate as described in claim 2, wherein the gas containing boron atoms includes diborane.

4. The method for forming an adherent, optically transparent, scratch-resistant diamond-like coating on a substrate as described in claim 2, wherein the inert gas include argon.

5. The method for forming an adherent, optically transparent, scratch-resistant diamond-like coating on a substrate as described in claim 1, wherein the substrate is selected from the group consisting of metals, plastics and glass.

6. The method for forming an adherent, optically transparent, scratch-resistant diamond-like coating on a substrate as described in claim 1, wherein the negative-pulsed bias voltage is between –50 V and –300 V.

7. The method for forming an adherent, optically transparent, scratch-resistant diamond-like coating on a substrate as described in claim 1, further comprising the step of immersing the substrate in an inert gas plasma before said step of immersing the biased substrate in a plasma containing ions simultaneously bearing carbon and hydrogen, whereby surface contamination is removed by sputter cleaning.

8. The method for forming an adherent, optically transparent, scratch-resistant diamond-like coating on a substrate as described in claim 7, wherein the negative-pulse biasing voltage is between –100 V and –1 kV.

9. The method for forming an adherent, optically transparent, scratch-resistant diamond-like coating on a substrate as described in claim 7, wherein the inert gas include argon.

10. The method for forming an adherent, optically transparent, scratch-resistant diamond-like coating on a substrate as described in claim 1, wherein the substrate is maintained at a temperature between 0° C. and 200° C. during said step of immersing the biased substrate in a plasma.

11. The method for forming an adherent, optically transparent, scratch-resistant diamond-like coating on a substrate as described in claim 1, wherein said step of immersing the biased substrate in a plasma containing ions simultaneously bearing carbon and hydrogen and ions containing a dopant species is achieved using an inductively coupled plasma source.

12. The method for forming an adherent, optically transparent, scratch-resistant diamond-like coating on a substrate as described in claim 11, wherein the inductively coupled plasma source is operated at pressures between 0.02 Pa and 1 Pa.

* * * * *